United States Patent
Zhang et al.

(10) Patent No.: US 9,805,972 B1
(45) Date of Patent: Oct. 31, 2017

(54) SKIP VIA STRUCTURES

(71) Applicant: GLOBALFOUNDRIES INC., Grand Cayman (KY)

(72) Inventors: Xunyuan Zhang, Albany, NY (US); Sean Xuan Lin, Watervliet, NY (US); James Jay McMahon, Clifton Park, NY (US); Shao Beng Law, Watervliet, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/437,065

(22) Filed: Feb. 20, 2017

(51) Int. Cl.
| | |
|---|---|
| *H01L 23/48* | (2006.01) |
| *H01L 23/52* | (2006.01) |
| *H01L 29/40* | (2006.01) |
| *H01L 21/768* | (2006.01) |
| *H01L 21/288* | (2006.01) |
| *H01L 23/522* | (2006.01) |
| *H01L 23/532* | (2006.01) |

(52) U.S. Cl.
CPC ...... *H01L 21/76816* (2013.01); *H01L 21/288* (2013.01); *H01L 21/7685* (2013.01); *H01L 21/76813* (2013.01); *H01L 21/76879* (2013.01); *H01L 23/5226* (2013.01); *H01L 23/53238* (2013.01)

(58) Field of Classification Search
CPC ........... H01L 23/49822; H01L 21/4857; H01L 21/486
USPC ......... 257/758, 759, 773, 774; 438/622, 637
See application file for complete search history.

(56) References Cited

U.S. PATENT DOCUMENTS

| | | | |
|---|---|---|---|
| 6,392,898 B1 | 5/2002 | Asai et al. | |
| 6,531,661 B2 | 3/2003 | Uchikawa et al. | |
| 9,089,050 B2* | 7/2015 | Kajiya | H05K 1/0206 |
| 2002/0182890 A1 | 12/2002 | Ishida et al. | |
| 2006/0289202 A1* | 12/2006 | Takeuchi | H01L 23/49827 174/262 |
| 2009/0119706 A1 | 5/2009 | Hope et al. | |
| 2009/0236143 A1 | 9/2009 | Nakamura | |
| 2017/0103944 A1* | 4/2017 | Fukui | H01L 21/4857 |
| 2017/0164458 A1* | 6/2017 | Vrtis | H05K 1/0201 |

FOREIGN PATENT DOCUMENTS

KR    20110096275    8/2011

* cited by examiner

*Primary Examiner* — S. V. Clark
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to skip via structures and methods of manufacture. The structure includes: a first wiring layer with one or more wiring structures; an upper wiring layer with one or more wiring structures, located above the first wiring layer; a blocking material which contacts at least one of the wiring structures of the upper wiring layer; a skip via with metallization, the skip via passes through the upper wiring layer and makes contact with the one or more wiring structures of the first wiring layer; and a conductive material in the skip via above the metallization and in a via interconnect above the blocking material.

20 Claims, 3 Drawing Sheets

US 9,805,972 B1

SKIP VIA STRUCTURES

FIELD OF THE INVENTION

The present disclosure relates to semiconductor structures and, more particularly, to skip via structures and methods of manufacture.

BACKGROUND

In via technology, a skip via can be formed through many insulator layers, e.g., bypassing one or more wiring structures within the insulator layers, to connect with a lower wiring structure. This provides improved resistance characteristics, minimizes capacitance for a lower wiring structure, e.g., at M0 layer, as well as provides area efficiencies in the chip manufacturing process.

There are many challenges to using skip vias. For example, in the manufacturing process, the skip via will need to land on a wiring structure in a lower level (e.g., M0 level), while the regular via will need to land on the wiring structure in an upper level (e.g., M1 or above level). Due to the skip via etching processes, though, damage will result at the interface between the wiring structure in the upper level and a via interconnect structure. That is, due to the different etch depths, the skip via etching process will result in surface damage to the upper wiring structure, e.g., copper material. This damage causes higher resistivity which, in turn, decreases device performance.

Also, in skip via processes, a conventional copper plating process is used to fill the vias. The copper plating process, though, grows from all directions including the sidewalls and bottom of the via resulting in extensive voids created due to pinch-off from sidewall growth and bottom voids from insufficient physical vapor deposition (PVD) seed coverage on the high aspect ratio via. Voids can also result from the undercut profile formed by ultra-low k (ULK) plasma-induced-damage (PID) or cap-to-interlevel dielectric selectivity. Also, the liner/seed is not sufficient to cover the full length of the high aspect ratio via, also resulting in void formation. These voids negatively affect the resistivity of the skip vias which, in turn, decreases device performance.

SUMMARY

In an aspect of the disclosure, a structure comprises: a first wiring layer with one or more wiring structures; an upper wiring layer with one or more wiring structures, located above the first wiring layer; a blocking material which contacts at least one of the wiring structures of the upper wiring layer; a skip via with metallization, the skip via passes through the upper wiring layer and makes contact with the one or more wiring structures of the first wiring layer; and a conductive material in the skip via above the metallization and in a via interconnect above the blocking material.

In an aspect of the disclosure, a method comprises: forming a via to expose one or more wiring structures of an upper wiring layer; forming a skip via which passes through the upper wiring layer and which exposes one or more wiring structures of a lower wiring layer; forming a blocking material in the via which covers the exposed one or more wiring structures of the upper wiring layer; selectively growing metal material in the skip via; and filling remaining portions of the skip via and the via with conductive material.

In an aspect of the disclosure, a method comprises: forming a wiring layer with one or more wiring structures in a lower wiring layer; forming a wiring layer with one or more wiring structures in an upper wiring layer, located above the lower wiring layer; forming a first via to expose the one or more wiring structures of the upper wiring layer and a second via which passes through the upper wiring layer and which ends above the lower wiring layer; forming a blocking material in the first via to block the exposed one or more wiring structures of the upper wiring layer; extending the second via landing on the lower wiring layer to form a skip via exposing the one or more wiring structures of the lower wiring layer, while the blocking material protects the exposed one or more wiring structures of the upper wiring layer; filling at least the skip via with conductive material to contact the one or more wiring structures of the lower wiring layer and in electrical connection with the one or more wiring structures of the upper wiring layer; and filling remaining portions of the skip via and the first via with a different conductive material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
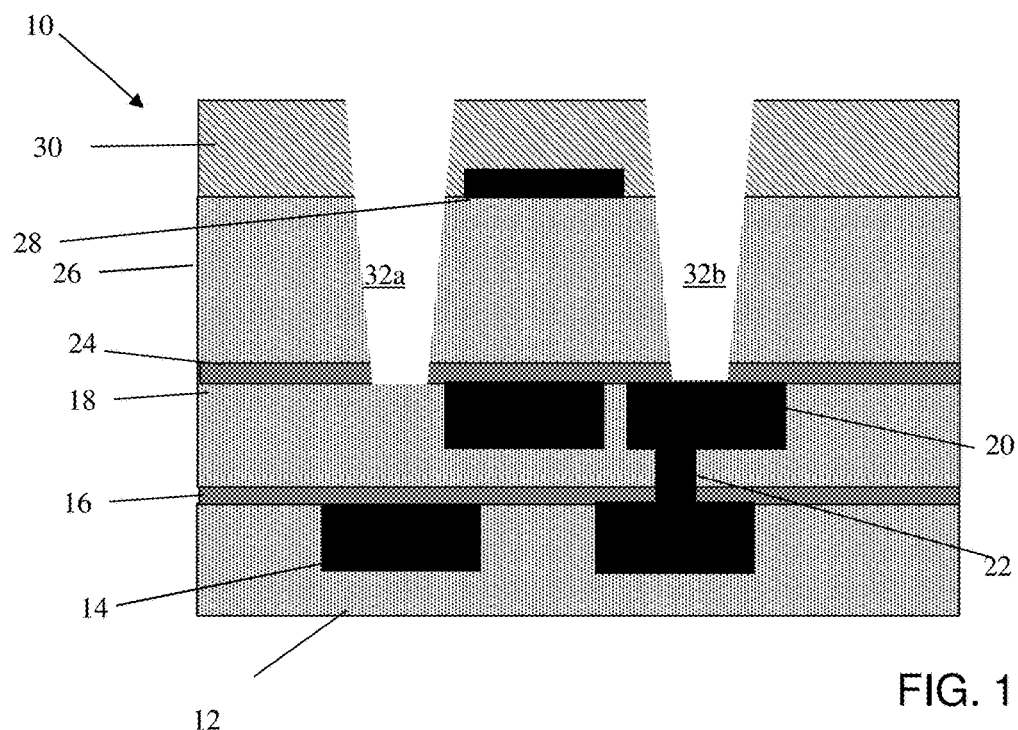
FIG. 1 shows a structure and respective fabrication processes in accordance with aspects of the present disclosure.

The present disclosure relates to semiconductor structures and, more particularly, to skip via structures and methods of manufacture. More specifically, the present disclosure provides manufacturing processes and resultant skip via structures which solve unequal via etch time issues of upper level via formation, e.g., damage from occurring to an upper wiring layer during skip via etching processes. Accordingly and advantageously, the manufacturing processes and resultant skip via structures will not result in damage to an upper wiring structure due to any difference of via etch depth. In other words, the methods provided herein will not result in an over etch of copper or other metallization material at the upper wiring level (e.g., M1 level) during skip via formation.

In additional embodiments, the present disclosure describes a selective electroless (Co or Ni) process that grows metal from the bottom-up in the skip via structure. By using the selective electroless metal (e.g., cobalt or nickel) growth process, cobalt or nickel will not form on the sidewalls of the skip via which, in turn, ensures that there is a void free fill regardless of profile and aspect ratio of the skip via. In this way, advantageously, extensive voids due to pinch-off from sidewall growth and bottom voids from insufficient physical vapor deposition (PVD) seed coverage on the high aspect ratio via can be prevented which, in turn, will decrease the resistivity of the skip vias and hence increase device performance.

In additional embodiments, the processes described herein provide a blocking material over an exposed surface of an upper wiring structure (e.g., M1 level) during the skip via etching process. In embodiments, the blocking material can protect an exposed surface of the upper wiring structure as well as prevent overgrowth of cobalt in the via and upper wiring layers. That is, the blocking material will serve as a mask to protect the upper wiring structure during skip via etching processes. The blocking material will also serve to prevent overgrowth of cobalt material within a regular via interconnect and wiring structure. Also, advantageously, the metal interconnect structures described herein can have an impact on back-end-of-the line (BEOL) and middle-of-the-line (MOL) interconnect structures for 7 nm devices and beyond, where conventional Cu metallization may not be extendable.

The skip via structures of the present disclosure can be manufactured in a number of ways using a number of different tools. In general, though, the methodologies and tools are used to form structures with dimensions in the micrometer and nanometer scale. The methodologies, i.e., technologies, employed to manufacture the skip via structures of the present disclosure have been adopted from integrated circuit (IC) technology. For example, the structures are built on wafers and are realized in films of material patterned by photolithographic processes on the top of a wafer. In particular, the fabrication of the skip via structures uses three basic building blocks: (i) deposition of thin films of material on a substrate, (ii) applying a patterned mask on top of the films by photolithographic imaging, and (iii) etching the films selectively to the mask.

FIG. 1 shows a structure and respective fabrication processes in accordance with aspects of the present disclosure. In embodiments, the structure 10 shown in FIG. 1 can be BEOL or MOL structures, as examples. In particular, the structure 10 includes a plurality of wiring levels, e.g., M0, M1, etc., in a die. For example, the structure 10 includes wiring structures 14 provided in an insulator material 12. As should be understood by those of skill in the art, the wiring structures 14 in the insulator material 12 are lower wiring structures, designated representatively at an M0 level; although the wiring structures 14 can be provided at any lower level of the structure.

The wiring structures 14 can be composed of any conductive material such as, e.g., copper, cobalt, ruthenium, tungsten, aluminum, etc., lined with TiN, TaN, Ti, Ta, ruthenium, cobalt, etc. In embodiments, the insulator material 14 is an oxide, e.g., interlevel dielectric material, which can be deposited by a conventional deposition method, e.g., chemical vapor deposition (CVD). The insulator material 14 can also be an ultra low-k dielectric material, a carbon doped insulator material or other insulator material with porosity.

The wiring structures 14 can be formed by conventional lithography, etching and deposition methods known to those of skill in the art. For example, a resist formed over the insulator material 12 is exposed to energy (light) to form a pattern (opening). An etching process with a selective chemistry, e.g., reactive ion etching (RIE), will be used to form one or more trenches in the insulator material 12 through the openings of the resist. The resist can then be removed by a conventional oxygen ashing process or other known strippants. Following the resist removal, conductive material can be deposited in the one or more trenches by any conventional deposition processes, e.g., chemical vapor deposition (CVD) processes. Any residual material 14 on the surface of the insulator material 12 can be removed by conventional chemical mechanical polishing (CMP) processes.

Following the CMP process, a capping layer 16 is formed on the wiring structures 14 and insulator material 12. In embodiments, the capping layer 16 can be a diffusion barrier layer, e.g., copper diffusion barrier layer, which prevents copper or other metallization diffusion to an upper insulator layer 18. The capping layer 16 can also prevent oxygen diffusion to the wiring structures 14.

Still referring to FIG. 1, wiring structures 20 and via interconnect structures 22 are formed in the upper insulator layer 18. In embodiments, the wiring structures 20 and the interconnect structures 22 can be formed in any wiring layer above that of the wiring structures 14. For example, the wiring structures 20 in the insulator material 18 are upper wiring structures, designated at an M1, M2, etc. level; whereas, the interconnect structures 22 can be designated V0, V1, etc., respectively. The wiring structures 20 and the interconnect structures 22 can be formed using conventional lithography, etching and deposition processes, similar to that which was discussed with respect to the formation of the lower wiring structures 14. The wiring structures 20 and the via interconnect structures 22 can be composed of any conductive material such as, e.g., copper, cobalt, ruthenium, tungsten, aluminum, etc., lined with TiN, TaN, Ti, Ta, ruthenium, cobalt, etc.

Following a CMP process to remove any residual material from the surface of the insulator material 18, a capping layer 24 is formed on the wiring structures 20 and insulator material 18. In embodiments, the capping layer 24 can be a diffusion barrier layer, e.g., copper diffusion barrier layer, as described above.

A masking material 28 is formed on the surface of the insulator material 26, between edges of selected wiring structures 20 on the M1 level and wiring structures 14 on the M0 level, for example. The masking material 28 can be TiN, deposited and patterned by conventional deposition and etching processes, e.g., RIE. A resist 30 is formed on the masking material 28 and insulator material 26, which is exposed to energy (light) to form a pattern (openings) in alignment with one or more wiring structures 14, 22 at the M0, M1 levels, respectively. An etching process with a selective chemistry, e.g., RIE, will be used to form one or more vias 32a, 32b in the insulator material 26 and capping layer 24, through the openings of the resist 30. The etching process is timed to stop at a depth in which a surface of the upper wiring structure 20 is exposed by the via 32b. In this way, the via 32b will be at a depth which lands on and exposes a surface of the wiring structure 20 on the M1 level.

Figure 2:
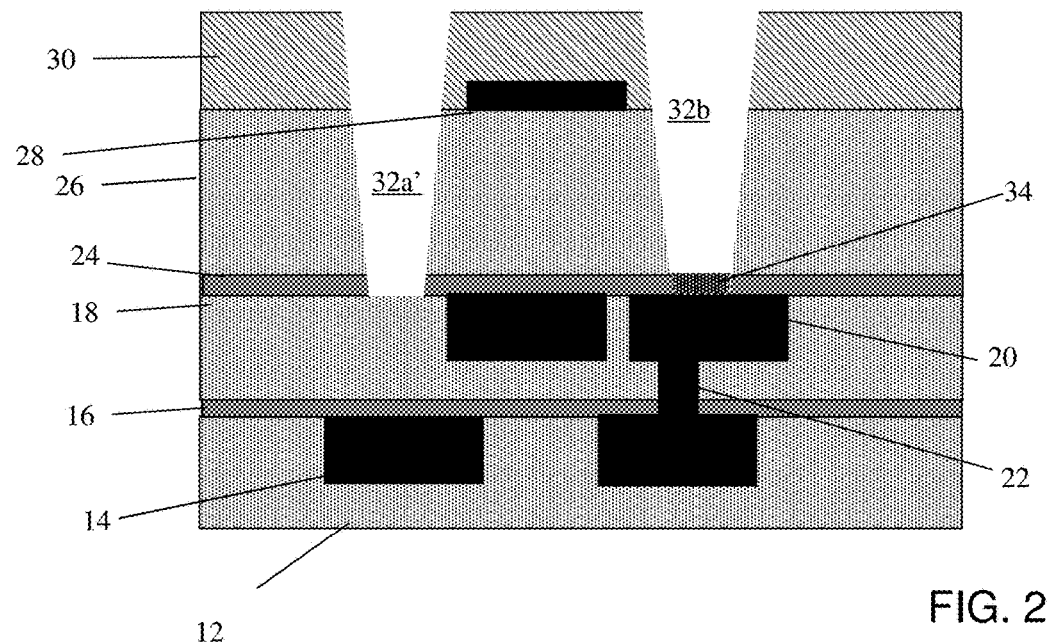
FIG. 2 shows a blocking material formed in a via opening, amongst other features, and respective fabrication processes in accordance with aspects of the present disclosure.

In FIG. 2, a blocking material 34 is formed in the via 32b, directly over and/or on the surface of the upper wiring structure 20. In embodiments, the blocking material 34 can be Mn selectively grown on the exposed surface of the wiring structure 20. In embodiments, the Mn is selectively grown on a surface of copper, e.g., copper wiring structure, by a chemical vapor deposition (CVD) or atomic layer deposition (ALD) process. The depth of the blocking material 34 is preferably 3 nm or less, for example. In alternative embodiments, the blocking material 34 can be CuSi or CuGe, formed by treating the Cu surface of the wiring structure with $SiH_4$ or $GeH_4$, respectively.

Figure 3:
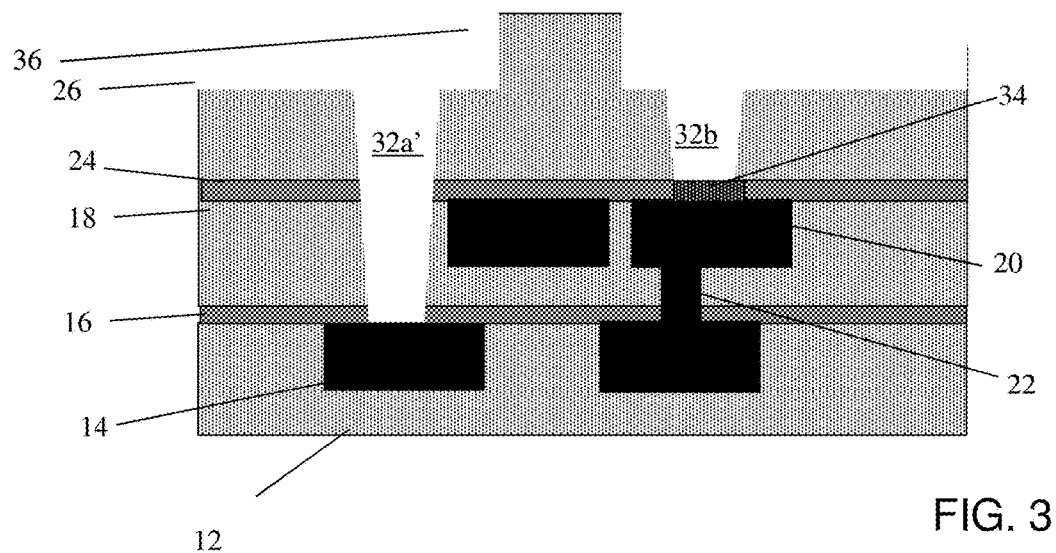
FIG. 3 shows a skip via structure, amongst other features, and respective fabrication processes in accordance with aspects of the present disclosure.

In FIG. 3, a skip via etching process continues through the upper levels (e.g., M1 level) to the wiring structure 14 on a lower level of the structure, e.g., M0 level. In embodiments, the skip via etch extends (deepens) the via 32a', landing on and exposing the wiring structure 14 on the lower level. During this skip via etching process, the blocking material 34 will protect (mask) the surface of the wiring structure 20 on the upper level (above the wiring structure 14) from damage which may be caused by the etch chemistries used in the skip via etching process.

The resist 30 can then be removed by a conventional oxygen ashing process or other known stripants, followed by a trench RIE to form a trench 36 (of an upper level, e.g., level M2) and then removal of the masking material 28 by wet processes. The blocking material 34 will also protect the surface of the wiring structure 20 on the M1 level during the removal of the masking material.

Figure 4:
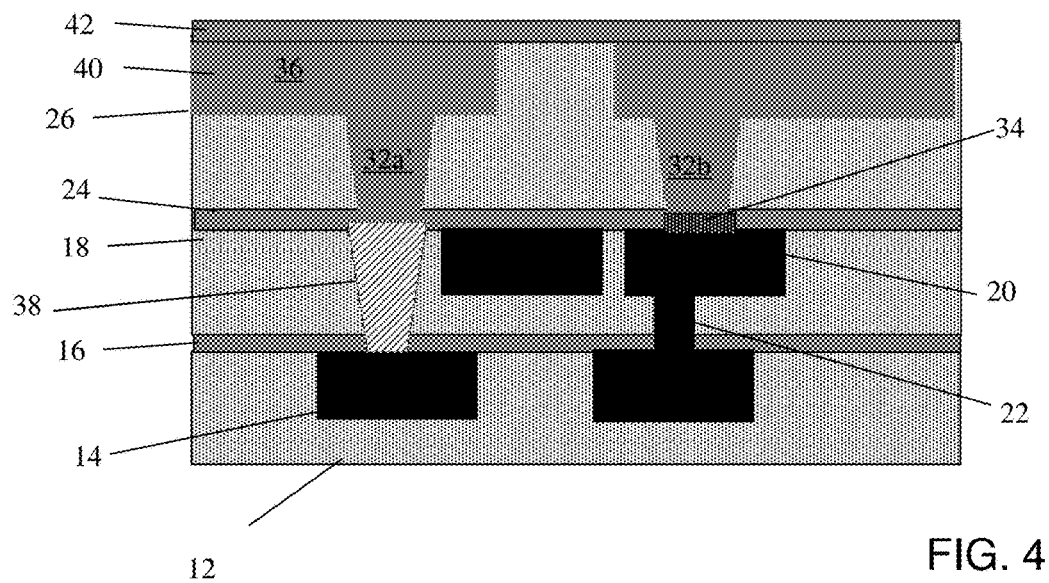
FIG. 4 shows metallization features in the skip via structure and regular via structure, amongst other features, and respective fabrication processes in accordance with aspects of the present disclosure.

As shown in FIG. 4, the vias 32a' and 32b and trench 36 are filled with conductive material 38 to form dual damascene structures, e.g., interconnect structures and upper wiring structures. It should be understood by those of skill in the art that the interconnect structure formed in the via 32a' will be a skip via structure, electrically and directly connecting to wiring structure 14 on the M0 level, e.g., bypassing any connections in the M1 or above level. The conductive material 38 in the via 32b, on the other hand, will be a regular via interconnect structure, providing electrical and direct connection to the wiring structure 20 on the lower level.

In more specific embodiments, the skip via 32a' is partially filled with cobalt (Co) 38; whereas, the blocking material 34 can, in embodiments, substantially prevent cobalt growth in the interconnect via 32b. In embodiments, the cobalt (Co) 38 is formed by a selective electroless growth process on the M0, M1 level, from the bottom upwards in the vias 32a'. More specifically, in embodiments, the cobalt (Co) 38 will selectively grow on the exposed metal surfaces of the one or more wiring structures 14 of a lower wiring layer, while not growing on the insulator sidewalls of the vias 32a', 32b or on the blocking material 34 in the via 32b, e.g., the cobalt (Co) 38 will not grow on the insulator material forming the sidewalls of the vias.

In this way, the cobalt (Co) 38 growth process will completely fill in the lower portion of the skip via 32a' from the bottom, upwards, preventing any void formation within the via 32a. In other words, the selective growth process will ensure that there is a void free fill of the skip via 32a, regardless of its profile and aspect ratio, seed coverage, ultra-low k (ULK) plasma-induced-damage (PID) on either the wiring structures 14 or cap-to-interlevel dielectric selectivity. This, in turn, void free formation of the interconnect structure will increase the resistivity of the skip via 32a'. It should also be understood by those of skill in the art that the electroless growth process of cobalt (Co) is compatible with dielectric materials, hence eliminating the need for a barrier layer.

As shown further in FIG. 4, the remaining portions of the skip via 32a', the regular via 32b and the trenches 36 (for upper wiring structures) are filled with conductive material 40 to form dual damascene structures, e.g., interconnect structures and upper wiring structures. In embodiments, the conductive material 40 can be copper, aluminum, tungsten, etc., to name a few contemplated materials. The conductive material 40 can be deposited by a conventional deposition method, e.g., electroplating, electroless deposition, CVD and/or plasma vapor deposition (PVD) and/or atomic layer deposition (ALD), followed by a conventional planarization process, e.g., CMP, to remove any residual material on the insulator layer 26. A capping layer 42 can then be formed over the insulator layer 26 and conductive material 40, followed by conventional BEOL processes (e.g., solder connect structures).

Figure 5:
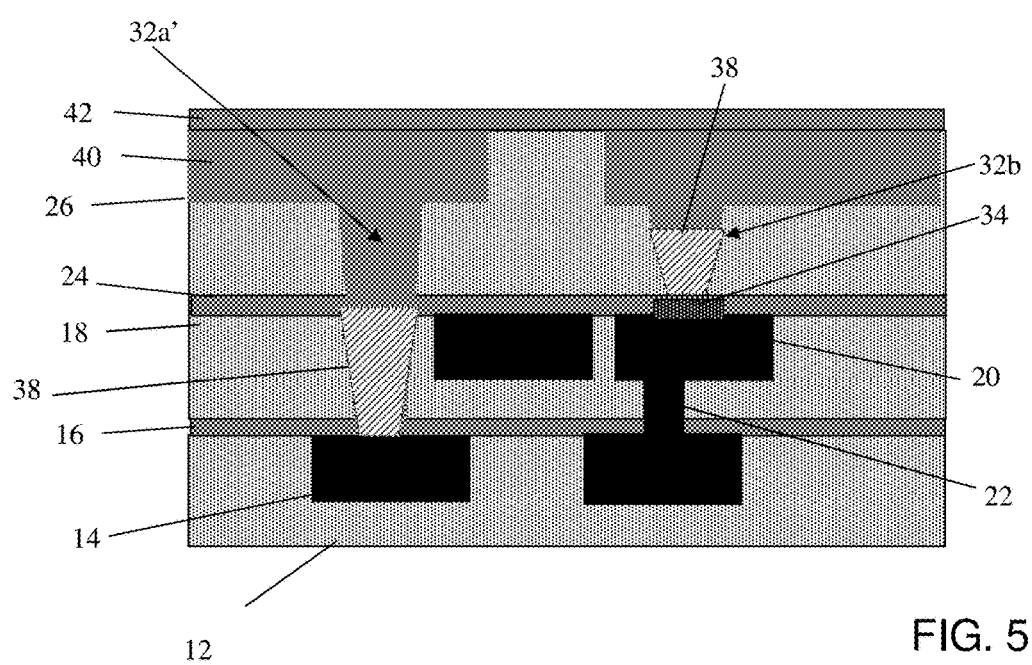
FIG. 5 shows an alternative structure and respective fabrication processes in accordance with additional aspects of the present disclosure.

FIG. 5 shows an alternative structure and respective fabrication processes in accordance with alternative aspects of the present disclosure. In this alternative embodiment, in any case that the cobalt (Co) 38 does grow within the via 32b, partially filling the via 32b with the cobalt material 38, the blocking material 34 in the trench 32b will inhibit cobalt (Co) 38 from overgrowing in the via 32b, e.g., growing above a height of the via 32b. That is, the Co growth rate should be less than in via 32a, and even such a lower Co growth can be used to fill the via 32b. Accordingly, in this embodiment, the blocking material 34 in the via 32b will significantly slow the growth process of the cobalt material 38, while being in direct electrical connection with the wiring structure 20 on the M1 level and the cobalt 38 in the via 32b. By way of example, the growth rate of the cobalt (Co) material 38 in the vias 32a', 32b can be about 2:1 on the respective surfaces, e.g., copper surface of the wiring structure 14 exposed by the via 32a' and blocking material 34 in the via 32b. The cobalt (Co) material 38, in turn, will be in direct electrical contact with the remaining conductive material 40.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a first wiring layer with one or more wiring structures;
   an upper wiring layer with one or more wiring structures, located above the first wiring layer;
   a blocking material which contacts at least one of the wiring structures of the upper wiring layer;
   a skip via with metallization, the skip via passes through the upper wiring layer and makes contact with the one or more wiring structures of the first wiring layer; and
   a conductive material in the skip via above the metallization and in a via interconnect above the blocking material.

2. The structure of claim 1, wherein the conductive material is part of the skip via and a wiring structure above the skip via.

3. The structure of claim 2, wherein the metallization is cobalt or nickel selectively grown in a via opening which passes through the upper wiring layer and which exposes the one or more wiring structures of the first wiring layer.

4. The structure of claim 3, wherein the cobalt or nickel partially fills the via opening.

5. The structure of claim 4, wherein the skip via is devoid of voids.

6. The structure of claim 4, wherein the cobalt or nickel partially fills a via above the blocking material.

7. The structure of claim 6, wherein the conductive material fills a wiring trench above the via and the upper wiring layer, and the conductive material forms a wiring structure.

8. The structure of claim 1, wherein the blocking material is Mn.

9. The structure of claim 1, wherein the blocking material is CuSi or CuGe, formed by treating a Cu surface of the wiring structure of the upper wiring layer with $SiH_4$ or $GeH_4$, respectively.

10. A method, comprising:
   forming a via to expose one or more wiring structures of an upper wiring layer;
   forming a skip via which passes through the upper wiring layer and which exposes one or more wiring structures of a lower wiring layer;
   forming a blocking material in the via which covers the exposed one or more wiring structures of the upper wiring layer;
   selectively growing metal material in the skip via; and
   filling remaining portions of the skip via and the via with conductive material.

11. The method of claim 10, wherein the selective growth of the metal material comprises selectively growing cobalt in the skip via to partially fill the skip via.

12. The method of claim 11, wherein the selective growth of the cobalt or nickel is an electroless growth process.

13. The method of claim 12, wherein the electroless growth process is from a bottom upwards within the skip via, starting from an exposed portion of the one or more wiring structures of the lower wiring layer.

14. The method of claim 10, wherein the conductive material is copper.

15. The method of claim 10, wherein the growth of the cobalt or nickel partially fills the via and the method further comprises filling remaining portions of the via and wiring trenches above the upper wiring layer with the conductive material.

16. The method of claim 10, wherein the blocking material is formed by a deposition of Mn.

17. The structure of claim 10, wherein the blocking material is CuSi or CuGe, formed by treating a surface of the wiring structure of the upper wiring layer with $SiH_4$ or $GeH_4$, respectively.

18. A method, comprising:
   forming a wiring layer with one or more wiring structures in a lower wiring layer;
   forming a wiring layer with one or more wiring structures in an upper wiring layer, located above the lower wiring layer;
   forming a first via to expose the one or more wiring structures of the upper wiring layer and a second via which passes through the upper wiring layer and which ends above the lower wiring layer;
   forming a blocking material in the first via to block the exposed one or more wiring structures of the upper wiring layer;
   extending the second via landing on the lower wiring layer to form a skip via exposing the one or more wiring structures of the lower wiring layer, while the blocking material protects the exposed one or more wiring structures of the upper wiring layer;
   filling at least the skip via with conductive material to contact the one or more wiring structures of the lower wiring layer and in electrical connection with the one or more wiring structures of the upper wiring layer; and
   filling remaining portions of the skip via and the first via with a different conductive material.

19. The method of claim 18, wherein the blocking material is Mn, CuSi or CuGe.

20. The method of claim 18, wherein the filling of the at least the skip via with conductive material is an electroless growth process of cobalt or nickel.

* * * * *